(12) United States Patent
He

(10) Patent No.: US 6,819,730 B2
(45) Date of Patent: Nov. 16, 2004

(54) FILTERING METHOD FOR DIGITAL PHASE LOCK LOOP

(75) Inventor: Tingbo He, Guangdong (CN)

(73) Assignee: Huawei Technologies Co., Ltd., Guangdong (CN)

( * ) Notice: Subject to any disclaimer, the term of this patent is extended or adjusted under 35 U.S.C. 154(b) by 0 days.

(21) Appl. No.: 10/205,750

(22) Filed: Jul. 26, 2002

(65) Prior Publication Data

US 2003/0021371 A1 Jan. 30, 2003

Related U.S. Application Data

(63) Continuation of application No. PCT/CN01/00068, filed on Jan. 20, 2001.

(30) Foreign Application Priority Data

Jan. 27, 2000 (CN) .......................................... 00101582 A

(51) Int. Cl.[7] .............................................. H03D 3/24
(52) U.S. Cl. ....................................... 375/376; 375/372
(58) Field of Search ................................ 375/326, 327, 375/372, 376, 354, 355, 371; 372/147, 156; 370/505; 713/400, 500, 501, 503

(56) References Cited

U.S. PATENT DOCUMENTS

| | | | | |
|---|---|---|---|---|
| 3,992,580 A | * | 11/1976 | Bittel et al. ................. | 375/356 |
| 4,811,340 A | * | 3/1989 | McEachern et al. ........ | 370/505 |
| 4,941,156 A | * | 7/1990 | Stern et al. ................. | 375/372 |
| 4,942,593 A | * | 7/1990 | Whiteside et al. .......... | 375/372 |
| 5,033,064 A | | 7/1991 | Upp | |
| 5,036,295 A | | 7/1991 | Kamitani | |
| 5,298,998 A | * | 3/1994 | Furumiya et al. ........... | 348/537 |
| 5,530,389 A | * | 6/1996 | Rieder ........................ | 327/156 |
| 5,619,543 A | * | 4/1997 | Glass .......................... | 375/376 |
| 5,633,898 A | * | 5/1997 | Kishigami et al. .......... | 375/344 |
| 5,638,411 A | * | 6/1997 | Oikawa ....................... | 375/372 |
| 5,745,011 A | | 4/1998 | Scott | |
| 5,898,744 A | * | 4/1999 | Kimbrow et al. ........... | 375/376 |
| 6,111,897 A | * | 8/2000 | Moon ......................... | 370/535 |
| 6,658,074 B1 | * | 12/2003 | Murakami .................. | 375/372 |

FOREIGN PATENT DOCUMENTS

WO        WO 97/15118        4/1997

OTHER PUBLICATIONS

International Search Report corresponding to International Application No. PCT/CN01/00068, dated Mar. 29, 2001.

* cited by examiner

Primary Examiner—Young T. Tse
Assistant Examiner—Sam K. Ahn
(74) Attorney, Agent, or Firm—Alston & Bird LLP

(57) ABSTRACT

A filtering method for digital phase lock loop, comprises defining an ideal phase difference value between an input clock and a local recovery clock; calculating a phase difference between the input clock and the local recovery clock by a subtractor; and comparing the phase difference with the ideal phase difference value to adjust the local recovery clock to keep its phase difference stable in the ideal phase difference value. When adjusting the local recovery clock, taking the ideal phase difference value as a center, the phase difference is divided into different segments. For segments where the ideal phase difference value is located, the local recovery clock follows the phase difference with a minimum changing rate; and for segments farther apart from the ideal phase difference value, the local recovery clock follows the phase difference with a faster changing rate. The invention concerns non-error code and vibration minimization at the same time, so vibration tolerance is better raised, vibration transfer characteristics are very good, and net output vibration indicators at low band and high band parts is improved.

13 Claims, 3 Drawing Sheets

FILTERING METHOD FOR DIGITAL PHASE LOCK LOOP

CROSS-REFERENCE TO RELATED APPLICATIONS

This is a continuation application of PCT/CN01/00068, filed Jan. 20, 2001, which is incorporated herein by reference in its entirety. The present application also claims the benefit of Chinese Patent Application No. 00101582.6, filed Jan. 27, 2000.

FIELD OF THE INVENTION

The present invention relates generally to digital phase lock loop technology, and more particularly, to a filtering method used in digital phase lock loop.

BACKGROUND OF THE INVENTION

Phase lock loop (PLL) is a closed loop tracking system which can track the phase and frequency of an input signal. When PLL tracks an input signal with constant frequency, there is no frequency difference. When PLL tracks an input signal with variable frequency, the tracking accuracy is very high.

There are two kinds of PLL: analog phase lock loop (APLL) and digital phase lock loop (DPLL). An APLL circuit consists of a phase detector (PD), a loop filter (LF) and a voltage-controlled oscillator (VCO). APLL has better vibration suppression performance, but has discreteness in technology, a higher manufacture cost and lower stability.

If a portion of a DPLL circuit comprises a digital circuit, it is generally referred to as a partial DPLL. The principle is similar to APLL, and as its frequency control still applies, some disadvantages, such as high discreteness, high manufacture difficulty and high cost, exist. DPPL consists of all digital circuits. A newer implementation method of DPPL is proposed by U.S. Pat. No. 5,033,064. The DPPL implemented by this method has better vibration transfer characteristics and net vibration output characteristics, but there is no effective loop filtering method and vibration filter performance at lower band frequencies is not ideal.

SUMMARY OF THE INVENTION

The present invention provides a filtering method for DPLL (DPLL is generally referenced herein to represent a DPLL circuit) that results in excellent DPPL vibration tolerance, vibration transfer and net vibration output performances, at lower band frequencies and higher band frequencies.

A filtering method for DPLL according to one embodiment of the present invention includes the steps of providing a first-in-first-out memory, then taking half-full of the memory as an ideal situation to define a ideal phase difference value between an input clock and a local recovery clock, calculating a read/write address difference of the first-in-first-out memory to define a phase difference between the input clock and the local recovery clock and comparing the phase difference with the ideal phase difference value. The filtering method further includes the steps of adjusting the local recovery clock in segments by taking the ideal phase difference value as a center; where at the segment where the ideal phase difference value is located, the local recovery clock follows the phase difference with a minimum changing speed; at other segments, the local recovery clock follows the phase difference with a changing speed increased segment by segment depending on a distance of the phase difference apart from the ideal phase difference value; at the segment apart farthest from the ideal phase difference value, the local recovery clock follows the phase difference with a maximum changing speed.

According to one aspect of the invention, the writing clock of the first-in-first-out memory is the input clock having been synchronized with a local crystal oscillator clock, and the reading clock of the first-in-first-out memory is the local recovery clock.

According to another aspect of the invention, adjusting the local recovery clock in segments by centered the ideal phase difference value is implemented by calculating a accumulated value through LF, which includes a phase sampling circuit samples the phase difference, where the LF calculates a accumulated value in segments according to difference between the phase difference sampled value and the ideal phase difference value. According to one aspect of the invention, if the phase difference deviates and the ideal phase difference value is larger, then the accumulated value follows the phase difference with a larger changing rate; if the phase difference deviates and the ideal phase difference value is smaller, then the accumulated value follows the phase difference with a small changing rate. Additionally, a digital frequency divider accumulates the accumulated value and the local recovery clock is received by controlling the local crystal oscillator dividing frequency. If the phase difference deviates and the ideal phase difference value is larger, then the local recovery clock increases the moving rate forward to the ideal value, which is larger; if the phase difference deviates the ideal phase difference value is smaller, then the local recovery clock moving rate is moved to a smaller ideal value.

According to yet another aspect of the invention, the digital frequency divider is implemented with an accumulator including an adder and a register, and their working frequency is provided by the local crystal oscillator. An integral part of the phase difference, inputted to the LF from said phase sampling circuit, is a read/write address difference, outputted from a subtracter, of the first-in-first-out memory, and the fractional part of the phase difference is output of the register of the digital frequency divider. The clock of the phase sampling circuit is a Frame signal (Fmclk) having been synchronized with the local crystal oscillator clock. The accumulated value may be a broken-lines continuous function of the phase difference.

Because the invention is based on DPLL, it can overcome weaknesses of APLL, which include large dispersion, high cost and low stability. The local recovery clock frequency (Fdco) of the present invention, which is outputted from the digital frequency divider, can adaptively adjust according to different frequency difference. When the phase difference between the input clock (Wclk) and the local recovery clock (Rclk) is far from the balance point, the local recovery clock frequency (Fdco) can move rapidly forward to nominal ideal frequency, but when the phase difference between the input clock (Wclk) and the local recovery clock (Rclk) is near the balance point, the local recovery clock frequency (Fdco) is adjusted with smaller rate. In this way, the present invention results in two advantageous important communication indicators: non-error code and minimized vibration, where vibration tolerance has been raised, the vibration transfer characteristic is good and net output vibration in low band frequency and high band frequency is improved over conventional circuits.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
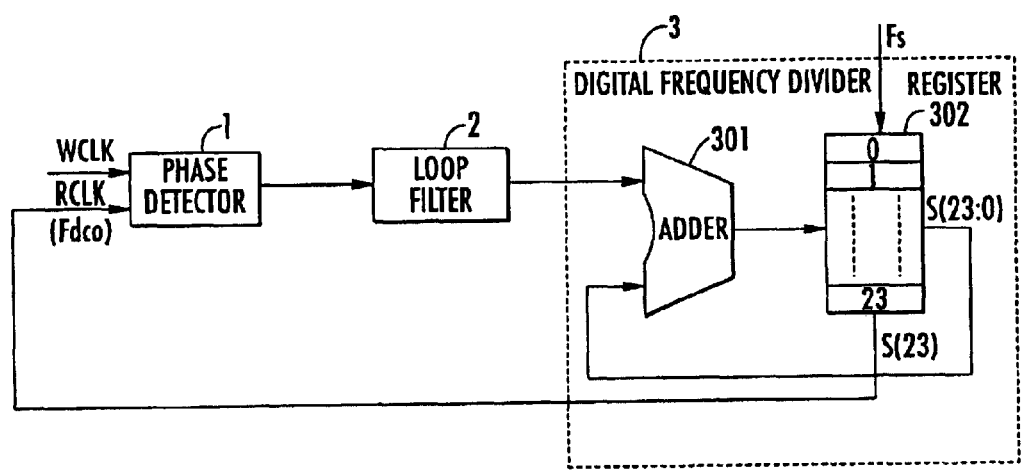
FIG. 1 is a block diagram of phase lock loop circuit.

FIG. 1 shows that a DPLL generally comprises a phase detector 1, a loop filter (LF) 2 and a digital frequency divider 3. The phase detector 1 receives an input clock (Wclk) and a local recovery clock (Rclk), makes frequency detection and phase detection, then outputs a phase difference to the LF 2. The LF 2 calculates an accumulated value K according to the phase difference. The digital frequency divider 3 comprises an adder 301 and a register 302. The adder 301 adds output data S of the register 302 and output data K of the LF 2, and the register 302 stores the current adding result at every rising edge of a local high-speed crystal oscillator Fs. Typically, the register has a bit length that equals the adder bit length, and the register only stores a sum without carry bit. The register 302 outputs to the adder 301 an accumulated data S(n:0), i.e. the result of last adding, so an accumulative function is implemented. The 'n' represents the adder bit length, and the most significant bit (MSB) of the accumulative sum is a local recovery clock frequency (Fdco) recovered by the digital frequency divider 3 whose output is provided to the phase detector for phase detection. The working frequency of the digital frequency divider 3 is provided by the local high-speed crystal oscillator Fs.

Figure 2:
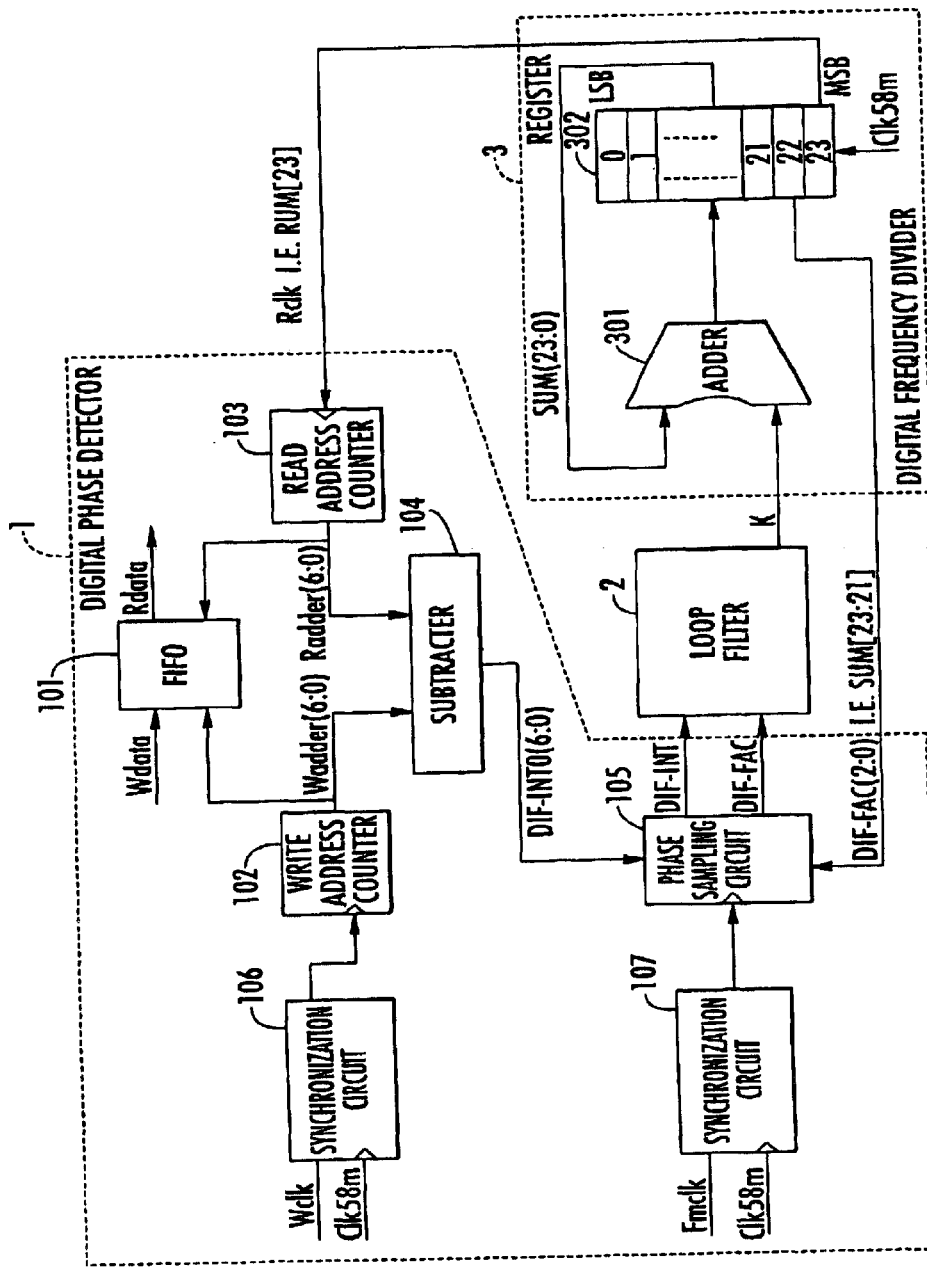
FIG. 2 is a circuit block diagram of an embodiment of the invention.

FIG. 2 is a circuit block diagram of an embodiment of the present invention. The circuit applies a 58.32 MHz local high-speed crystal oscillator to recover an ideal 2.048 MHz clock with minimized vibration, and the digital frequency divider 3 applies a 24 bit length adder. The digital phase detector 1 performs frequency detection and phase detection of PLL, and includes: a 128 bit depth first-in-first-out memory (FIFO) 101, a read address counter 103, a write address counter 102, a subtracter (WADDR-RADDR) 104, a phase sampling circuit 105 and a synchronization circuit 106, 107. The subtracter 104 calculates a read/write address difference which has been sampled by a frame clock (Fmclk), then as an integral part of the phase difference Dif-int is inputted to the LF 2.

The fractional part of the phase difference Dif-fac which is inputted to the LF 2 is the three most significant bits Sum(23:21) outputted by the digital frequency divider 3. The LF 2 calculates, according to a method described in detail below, an accumulated value K based on the phase difference, and outputs the calculating data to the digital frequency divider 3 to implement accumulation. The clock of the phase sampling circuit 105 is Fmclk that has been synchronized by a local high-speed crystal oscillator Clk58m. Fmclk is a frame signal which appears at specific position of frame head for every frame. The digital frequency divider 3 accumulates the LF 2 output data K(23:0) under the clock of local high-speed crystal oscillator Clk58m. The carry bit of addition is overflowed automatically and the addition sum is stored to the register group 302 Sum(23:0) at every Clk58m rising edge. The most significant bit Sum(23) of the register group 302 is the local recovery clock Rclk.

The LF 2, i.e. a filtering operational module of a PLL, implements an operational function of accumulated value K, and adjusts the local recovery clock frequency Fdco outputted from the digital frequency divider 3. The operational method according to one aspect of the invention is as follows. First, half-full of the first-in-first-out memory (FIFO) is taken as a balance point to define an ideal phase difference value. In this embodiment, depth of the FIFO is 128 bit, so the balance point, i.e. ideal phase difference value, is 64 bit. The subtracter 104 calculates the phase difference (W-R) between the input clock frequency Fref and the local recovery clock frequency Fdco according to output of the write address counter 102 WADDR(6:0) and output of the read address counter RADDR(6:0), and the calculating result Dif-int0(6:0), after sampled by frame clock, sends to the LF 2 as an integral part of the phase difference Dif-int. The write clock of the FIFO is the input clock Wclk having been synchronized by local high-speed crystal oscillator clock Clk58m, and the read clock of the FIFO is the local recovery clock Rclk. The digital frequency divider 3 outputs to the phase sample circuit 105 a data Dif-fac(2:0) which is the three most significant bits of 24 bit length register 302 Sum(23:21). Data Dif-fac(2:0), after phase sampling, outputs to the LF 2 as a fraction part of the phase difference Dif-fac.

The LF 2, i.e. filtering operational module, calculates the accumulated value K in segments according to difference between output data of the phase sample circuit Dif-int, Dif-fac and the ideal phase difference value 64 bit. When the phase difference (W-R) deviates largely from the ideal phase difference value 64 bit, the accumulated value K follows the phase difference (W-R) with a larger changing rate; when the phase difference (W-R) deviates small from the ideal phase difference value 64 bit, the accumulated value K follows the phase difference (W-R) with a small changing rate. The accumulated value K is then outputted to the digital frequency divider 3 for accumulation. Therefore, when the phase difference (W-R) deviates largely from the ideal phase difference value 64 bit, the local recovery clock frequency Rclk, i.e. the most significant bit Sum(23), moves toward the nominal ideal frequency 2.048 MHz with a higher rate; when the phase difference (W-R) deviates small from the ideal phase difference value 64 bit, the local recovery clock frequency Rclk moves toward nominal ideal frequency 2.048 MHz with a lower rate.

In the embodiment, the LF calculates the accumulated value K with a method utilizing seven segments and four coefficients which can be expressed with functions as followings:

$$K(x) = \begin{cases} K0 - 16(\alpha 0 + \alpha 1 + \alpha 2) - (16 - x)\alpha 3 & 0 < x \leq 16 \\ K0 - 16(\alpha 0 + \alpha 1) - (32 - x)\alpha 2 & 16 < x \leq 32 \\ K0 - 16\alpha 0 - (48 - x)\alpha 1 & 32 < x \leq 48 \\ K0 - (64 - x)\alpha 0 & 48 < x \leq 80 \\ K0 + 16\alpha 0 + (x - 80)\alpha 1 & 80 < x \leq 96 \\ K0 + 16(\alpha 0 + \alpha 1) + (x - 96)\alpha 2 & 96 < x \leq 112 \\ K0 + 16(\alpha 0 + \alpha 1 + \alpha 2) + (x - 112)\alpha 3 & 112 < x \leq 128 \end{cases}$$

Wherein x is the phase difference (W-R) between the input reference clock and the local recovery clock;

K(x) shows that the accumulated value K is a function of x;

K0 is an accumulated value outputted by the LF when the phase difference x=64 bit; a specific value of K0 is decided by the local recovery clock nominal frequency Fdco, the local high-speed crystal oscillator frequency Fs and bit length n of the accumulator, in the embodiment K0 value is:

$$K0=(Fdco \times 2^n)/Fs=(2.048\times 2^{24})/58.32=589159$$

$\alpha 0, \alpha 1, \alpha 2, \alpha 3$ are four coefficients which reflects that the accumulated value K follows the phase difference (W-R) with what changing speed, and requires that $\alpha 0<\alpha 1<\alpha 2<\alpha 3$ to guarantee that the phase difference deviates at segments farther from the ideal phase difference value, the accumulated value K follows the phase difference with a more fast changing speed; in the embodiment, taking $\alpha 0=1$, $\alpha 1=2$, $\alpha 2=3$, $\alpha 3=4$.

Because in the embodiment the depth of the FIFO is 128 bit, the phase difference possible value scope is 0~128 bit.

Figure 3:
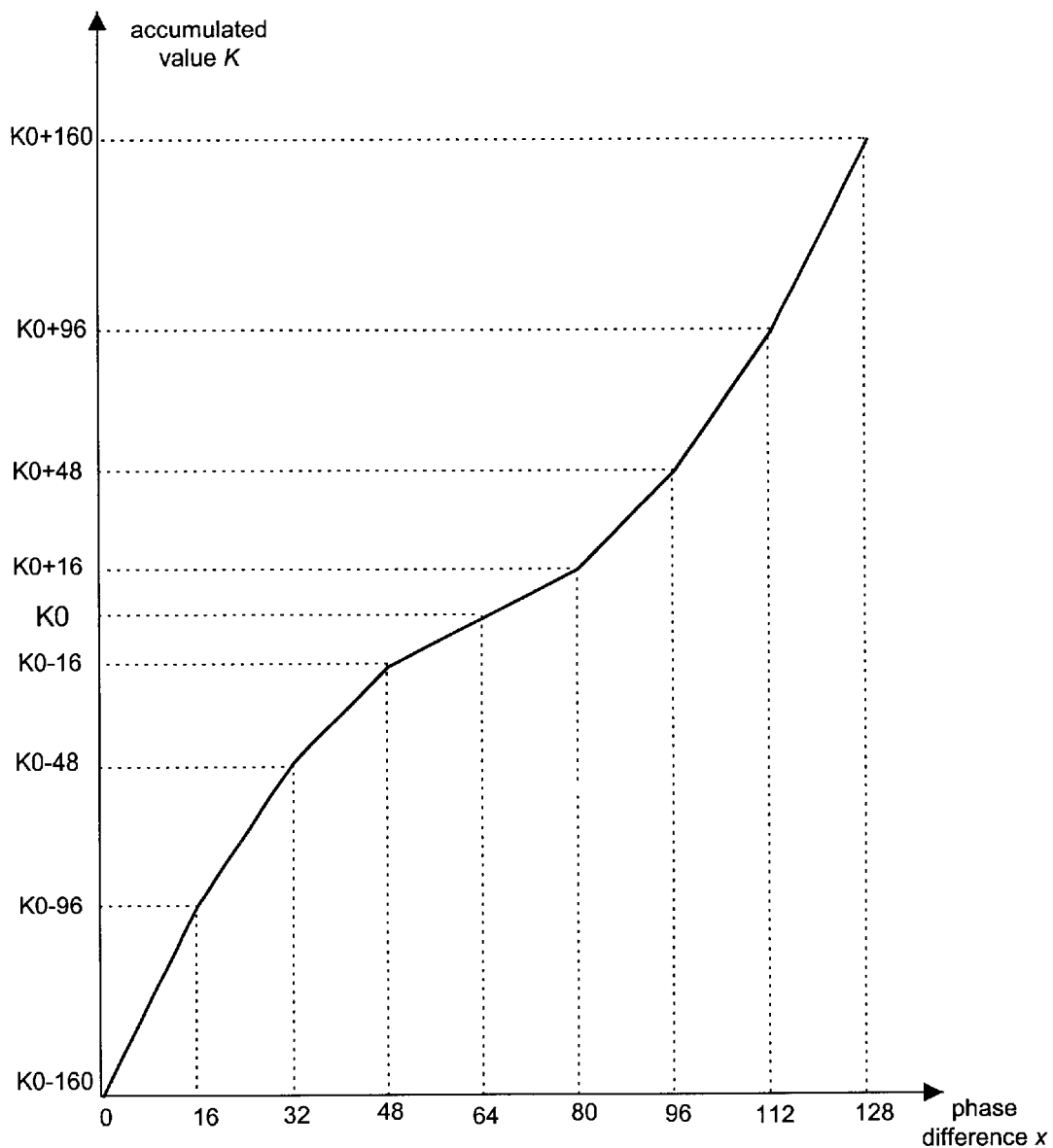
FIG. 3 is a filtering operational function diagram.

FIG. 3 shows that the accumulated value K is a broken-line continuous function of the phase difference x. At segments where the phase difference deviates farthest from the ideal phase difference value 64 bit, such as at 0~16 bit and 112~128 bit segments, where the slope of the segments is steepest, the accumulated value K follows the phase difference with highest changing speed, which corresponds (or evidences) the local recovery clock frequency Fdco moving to nominal idea frequency 2.048 MHz with a fastest speed. At segments where the phase difference deviates farther from the ideal phase difference value, such as 16~32 bit and 96~112 bit, where the slope of the segments is steeper, the accumulated value K follows the phase difference with higher changing speed, which corresponds (or evidences) that the local recovery clock frequency Fdco moves to nominal idea frequency 2.048 MHz with a faster speed. At segments where the phase difference deviate small from the ideal phase difference value, such as 32~48 bit and 80~96 bit, slope of the segments is small, the accumulated value K follows the phase difference with smaller changing speed, which evidences that the local recovery clock frequency Fdco moves to nominal idea frequency 2.048 MHz with a slower speed. At segment where the phase difference deviation is minimum from the ideal phase difference value, such as 48~80 bit, slope of the segments is most flat, the accumulated value K follows the phase difference with lowest changing speed, which evidences that the local recovery clock frequency Fdco moves to nominal idea frequency 2.048 MHz with a lowest speed. Therefore, it is implemented without error code and at the same time vibration minimization is also concerned, so DPLL vibration tolerance is beneficially raised, vibration transfer characteristic is enhanced, and net output vibration indicators at low-band and high-band are improved. In the embodiment discussed above, when reference clock frequency is 20 Hz, vibration tolerance is 60 UI, vibration suppression characteristic is higher than −30 db; when reference clock frequency is 20~18 KHz, net output vibration is less than 0.1 UI; and when reference clock frequency is 18~100 KHz, net output vibration is 0.035 UI in general.

The DPLL filtering method of the present invention first defines an ideal phase difference value between an input clock and a local recovery clock, then calculates a phase difference between the input clock and the local recovery clock by a subtracter. The phase difference is compared with the ideal phase difference value and the local recovery clock is adjusted to keep the phase difference stable at the ideal phase difference value. Adjusting the local recovery clock divides the phase difference into segments with the ideal phase difference value as a center. For a segment where the ideal phase difference value is located, the local recovery clock follows the phase difference with a minimum changing speed; however, for segments where the phase difference is farther from the ideal phase difference value, the local recovery clock follows the phase difference with a faster changing speed.

Any revision, equivalence replacement and improvement etc. within the spirit and principles of the invention must be all included in the appended claims of the invention.

What is claimed is:

1. A filtering method for a digital phase lock loop, comprising:

providing a first-in-first-out memory and defining an ideal phase difference value between an input clock and a local recovery clock based upon a half-full memory;

calculating a read and write address difference of the first-in-first-out memory to define a phase difference between the input clock and the local recovery clock;

comparing the phase difference with the ideal phase difference value; and adjusting the local recovery clock in segments by taking the ideal phase difference value as a center, wherein at the segment where the ideal phase difference value is located, the local recovery clock follows the phase difference with a minimum changing speed, and at other segments, the local recovery clock follows the phase difference with a changing speed increased segment by segment based upon a distance of the phase difference from the ideal phase difference value, and wherein at the segment apart farthest from the ideal phase difference value, the local recovery clock follows the phase difference with a maximum changing speed, and wherein adjusting the local recovery clock in segments comprises calculating an accumulated value by a loop filter, and wherein calculating the accumulated value comprises sampling the phase difference by a phase sampling circuit to generate a phase difference value and calculating the accumulated value in segments by the loop filter based upon a difference between the phase difference sampled value and the ideal phase difference value.

2. The method according to claim 1, wherein the first-in-first-out memory receives a writing clock and a reading clock, the writing clock comprises the input clock synchronized with a local crystal oscillator clock and the reading clock, of the first-in-first-out memory is the local recovery clock.

3. The method according to claim 1, wherein an increased changing rate follows the phase difference when there is a relatively large difference between the phase difference sampled value and the ideal phase difference value.

4. The method according to claim 1, wherein a reduced changing rate follows the phase difference when there is a relatively small difference between the phase difference sampled value and the ideal phase difference value.

5. The method of claim 1, further comprising the step of accumulating the accumulated value by a digital frequency divider, where the local recovery clock is received by controlling a local crystal oscillator clock dividing frequency.

6. The method of claim 5, further comprising the step of utilizing a large local recovery clock moving rate for large deviations of the phase difference from the ideal phase difference value.

7. The method of claim 5, further comprising the step of utilizing a small local recovery clock moving rate for smaller deviations of the phase difference from the ideal phase difference value.

8. The method according to claim 5, where the step of accumulating the accumulated value by the digital frequency divider comprises accumulating the accumulated value by an accumulator comprising an adder and a register having a working frequency provided by a local crystal oscillator clock.

9. The method according to claim 1, wherein calculating the accumulated value comprises sampling the phase difference using a phase sampling circuit clock having a frame signal synchronized by a local crystal oscillator clock.

10. The method according to claim 1, wherein calculating the accumulated value in segments comprises calculating the accumulated value using a broken-lines continuous function of the phase difference.

11. A filtering method for digital phase lock loop, comprising:

providing a first-in-first-out memory and defining an ideal phase difference value between an input clock and a local recovery clock based upon a half-full memory;

calculating a read and write address difference of the first-in-first-out memory to define a phase difference between the input clock and the local recovery clock;

comparing the phase difference with the ideal phase difference value; and adjusting the local recovery clock in segments by taking the ideal phase difference value as a center, wherein at the segment where the ideal phase difference value is located, the local recovery clock follows the phase difference with a minimum changing speed, and at other segments, the local recovery clock follows the phase difference with a changing speed increased segment by segment based upon a distance of the phase difference from the ideal phase difference value, and wherein at the segment apart farthest from the ideal phase difference value, the local recovery clock follows the phase difference with a maximum changing speed; wherein calculating an accumulated value comprises sampling the phase difference by a phase sampling circuit to generate a phase difference value and calculating the accumulated value in segments by a loop filter based upon a difference between the phase difference sampled value and the ideal phase difference value and the phase difference input to the loop filter from the phase sampling circuit is the read and write address difference, outputted from a subtracter, and wherein a fractional element of the phase difference is output of a register of a digital frequency divider.

12. A digital phase lock loop filtering method, comprising:

providing a first-in-first-out memory, and defining an ideal phase difference value between an input clock and a local recovery clock based upon a half-full memory location point;

calculating a read and write address difference of the first-in-first-out memory to define a phase difference between the input clock and the local recovery clock;

comparing the phase difference with the ideal phase difference value;

adjusting the local recovery clock in segments by taking the ideal phase difference value as a center, wherein at the segment where the ideal phase difference value is located, the local recovery clock follows the phase difference with a minimum changing speed, and at other segments, the local recovery clock follows the phase difference with a changing speed increased segment by segment based upon a distance of the phase difference from the ideal phase difference value, and wherein at the segment apart farthest from the ideal phase difference value, the local recovery clock follows the phase difference with a maximum changing speed, wherein providing the first-in-first-out memory comprises providing the first-in-first-out memory having a 128 bit depth, and wherein the ideal phase difference value is defined as 64 bit; and applying seven segments and four coefficients to an algorithm to calculate an accumulated value according to a difference between a phase difference sampling value and the ideal phase difference value, wherein the algorithm is represented with functions:

$$K(x) = \begin{cases} K0 - 16(\alpha 0 + \alpha 1 + \alpha 2) - (16 - x)\alpha 3 & 0 < x \leq 16 \\ K0 - 16(\alpha 0 + \alpha 1) - (32 - x)\alpha 2 & 16 < x \leq 32 \\ K0 - 16\alpha 0 - (48 - x)\alpha 1 & 32 < x \leq 48 \\ K0 - (64 - x)\alpha 0 & 48 < x \leq 80 \\ K0 + 16\alpha 0 + (x - 80)\alpha 1 & 80 < x \leq 96 \\ K0 + 16(\alpha 0 + \alpha 1) + (x - 96)\alpha 2 & 96 < x \leq 112 \\ K0 + 16(\alpha 0 + \alpha 1 + \alpha 2) + (x - 112)\alpha 3 & 112 < x \leq 128 \end{cases}$$

where:

x is the phase difference between the input clock and the local recovery clock;

K0 is the accumulated value, outputted from a loop filter and determined by a local recovery clock frequency, a local crystal oscillator frequency and the bit length of the accumulator applied by a digital frequency divider, when the phase difference x is the ideal phase difference value 64 bit; and the accumulated value in every segment follows the phase difference x with linear function, and segment slopes are $\alpha 3$, $\alpha 2$, $\alpha 1$, $\alpha 0$, respectively, and $\alpha 0 < \alpha 1 < \alpha 2 < \alpha 3$.

13. The method according to claim 12, wherein $\alpha 0 = 1$, $\alpha 1 = 2$, $\alpha 2 = 3$, $\alpha 3 = 4$.

* * * * *